(12) United States Patent
Yen

(10) Patent No.: US 11,437,425 B2
(45) Date of Patent: Sep. 6, 2022

(54) IMAGE SENSING DEVICE

(71) Applicant: GUANGZHOU LUXVISIONS INNOVATION TECHNOLOGY LIMITED, Guangzhou (CN)

(72) Inventor: Shih-Chieh Yen, Guangzhou (CN)

(73) Assignee: GUANGZHOU LUXVISIONS INNOVATION TECHNOLOGY LIMITED, Science (CN)

( * ) Notice: Subject to any disclaimer, the term of this patent is extended or adjusted under 35 U.S.C. 154(b) by 41 days.

(21) Appl. No.: 16/950,378

(22) Filed: Nov. 17, 2020

(65) Prior Publication Data
US 2021/0066383 A1 Mar. 4, 2021

(30) Foreign Application Priority Data
Nov. 18, 2019 (TW) .................................. 108141842

(51) Int. Cl.
*H01L 27/146* (2006.01)
*H04N 5/369* (2011.01)

(52) U.S. Cl.
CPC .. *H01L 27/14647* (2013.01); *H01L 27/14667* (2013.01); *H04N 5/36965* (2018.08)

(58) Field of Classification Search
CPC ......... H01L 27/14647; H01L 27/14667; H01L 27/14634; H01L 27/1464; H01L 27/14621; H01L 27/14627; H01L 27/14649; H01L 27/14645; H04N 5/36965; H04N 9/04553; H04N 9/04559; H04N 13/261; H04N 13/204; H04N 13/271; G06T 7/50
See application file for complete search history.

(56) References Cited

U.S. PATENT DOCUMENTS 9,947,711 B2 * 4/2018 Minixhofer ......... H01L 27/3269
10,461,106 B2 * 10/2019 Ozawa .............. H01L 27/14623
2020/0328239 A1 * 10/2020 Yen .................... H01L 27/14627

FOREIGN PATENT DOCUMENTS

| CN | 105991978 A | 10/2016 |
| TW | 201421993 A | 6/2014 |
| TW | I527454 B | 3/2016 |
| TW | 201710641 A | 3/2017 |

* cited by examiner

*Primary Examiner* — Seung C Sohn
(74) *Attorney, Agent, or Firm* — Birch, Stewart, Kolasch & Birch, LLP

(57) ABSTRACT

An image sensing device includes a sensing module and an invisible light transmitter. The sensing module includes pixel sets arranged on a substrate. The pixel set includes sub pixels, an invisible light sensor, and a focus adjustment member. The sub pixels and the invisible light sensor are arranged in an array. The sub pixel includes a visible light photo diode. The invisible light sensor includes an invisible light photo diode. The focus adjustment member is between the substrate and the visible light photo diode or the invisible light photo diode. The focus adjustment member makes a distance between the visible light photo diode and the substrate less than or greater than a distance between the invisible light photo diode and the substrate. The invisible light transmitter is disposed corresponding to the sensing module. The invisible light sensor is configured to sense invisible light transmitted by the invisible light transmitter.

10 Claims, 7 Drawing Sheets

IMAGE SENSING DEVICE

CROSS-REFERENCE TO RELATED APPLICATION

This non-provisional application claims priority under 35 U.S.C. § 119(a) to Patent Application No. 108141842 filed in Taiwan, R.O.C. on Nov. 18, 2019, the entire contents of which are hereby incorporated by reference.

BACKGROUND

Technical Field

The present invention relates to an image sensor, and in particular, to an image sensing device capable of shooting a three-dimensional image.

Related Art

There is a photographing device capable of shooting a three-dimensional image. The photographing device includes a sensing module. The sensing module is provided with a pixel array and a depth sensor. The pixel array can receive a visible light ray to generate a two-dimensional image. The depth sensor can calculate depth data. The photographing device can combine the depth data with the two-dimensional image to generate a three-dimensional image. There are several types of existing depth sensors. For example, a depth sensor captures two two-dimensional images simultaneously by using two parallel image sensors, and calculates a phase difference between the two two-dimensional images, so as to reckon depth data between an object in the image and an imaging surface. Another depth sensor has a time of flight (TOF) sensing unit and an invisible light transmitter. Such TOF sensing unit can receive invisible light transmitted by the invisible light transmitter, and can calculate depth data based on a time difference between a time point when the invisible light transmitter transmits the invisible light and a time point when the TOF sensing unit receives the invisible light.

SUMMARY

An existing three-dimensional image photographing device by using TOF technologies has a problem of focusing. In detail, a pixel array configured to receive visible light in a sensing module and a TOF sensing unit configured to receive invisible light receive incident light from a same lens of the photographing device. However, based on a wavelength of visible light and invisible light or various lenses or filters, etc. in the photographing device, focal lengths of the pixel array and the TOF sensing unit may be different. Consequently, when the pixel array is focused correctly to generate a clear two-dimensional image, the TOF sensing unit cannot focus correctly, resulting in inaccurate depth data. Conversely, if the TOF sensing unit performs focusing correctly, a corresponding two-dimensional image may be blurred due to incorrect focusing.

In view of the foregoing problems, the present invention and its embodiments are presented below to provide an image sensing device, in order to resolve a problem of incorrect depth data or a blurred image due to incorrect focusing.

According to an embodiment of the present invention, an image sensing device includes a sensing module and an invisible light transmitter. The sensing module includes a plurality of pixel sets and a substrate. The pixel sets are arranged on the substrate. Each pixel set includes a plurality of sub pixels, at least one invisible light sensor, and at least one focus adjustment member. The plurality of sub pixels and the invisible light sensor are arranged in an array. Each sub pixel includes a visible light photo diode. The invisible light sensor includes an invisible light photo diode. The focus adjustment member is between each visible light photo diode and the substrate or between the invisible light photo diode and the substrate. The focus adjustment member makes a distance between each visible light photo diode and the substrate less than or greater than a distance between the invisible light photo diode and the substrate. The invisible light transmitter is disposed corresponding to the sensing module. The invisible light sensor is configured to sense invisible light transmitted by the invisible light transmitter.

Based on the foregoing, according to the image sensing device proposed by the embodiments of the present invention, the focus adjustment member may change the distance between each visible light photo diode and the lens assembly or the distance between the invisible light photo diode and the lens assembly. Accordingly, the visible light and the invisible light may be focused on the sub pixels and the invisible light sensor correctly, to generate a clear two-dimensional image and accurate depth data simultaneously. Through combination of the depth data with the two-dimensional image, the image sensing device can generate a three-dimensional image quickly and accurately.

Detailed features and advantages of the present invention are described in detail in the following implementations. Content of the implementations is sufficient to enable a person skilled in the art to understand technical content of the present invention and implement the present invention accordingly. According to the content, the scope of claims, and the drawings disclosed in this specification, a person skilled in the art can understand a related purpose and advantages of the present invention easily.

DETAILED DESCRIPTION

Figure 1:
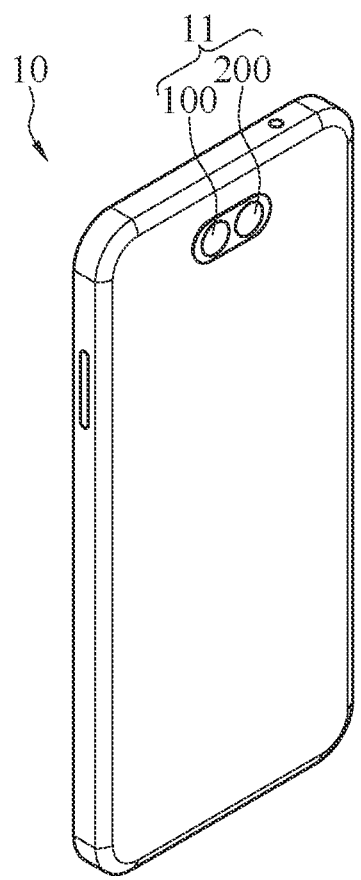
FIG. 1 is a schematic diagram of an image sensing device applied to a mobile phone according to an embodiment of the present invention.

Referring to FIG. 1, FIG. 1 is a schematic diagram of an image sensing device 11 applied to a mobile phone 10 according to an embodiment of the present invention. As shown in FIG. 1, the mobile phone 10 may be a smart phone. The image sensing device 11 may be configured to shoot a three-dimensional image. The image sensing device 11 includes a photographing assembly 100 and an invisible light transmitter 200. The photographing assembly 100 and the invisible light transmitter 200 are arranged side by side and spaced apart on the mobile phone 10. However, Relative positions of the photographing assembly 100 and the invisible light transmitter 200 are not limited to this embodiment. In different embodiments, the image sensing device 11 may be applied to any electronic device, such as a driving recorder, a digital camera, or an automatic driving assistance device.

Figure 2:
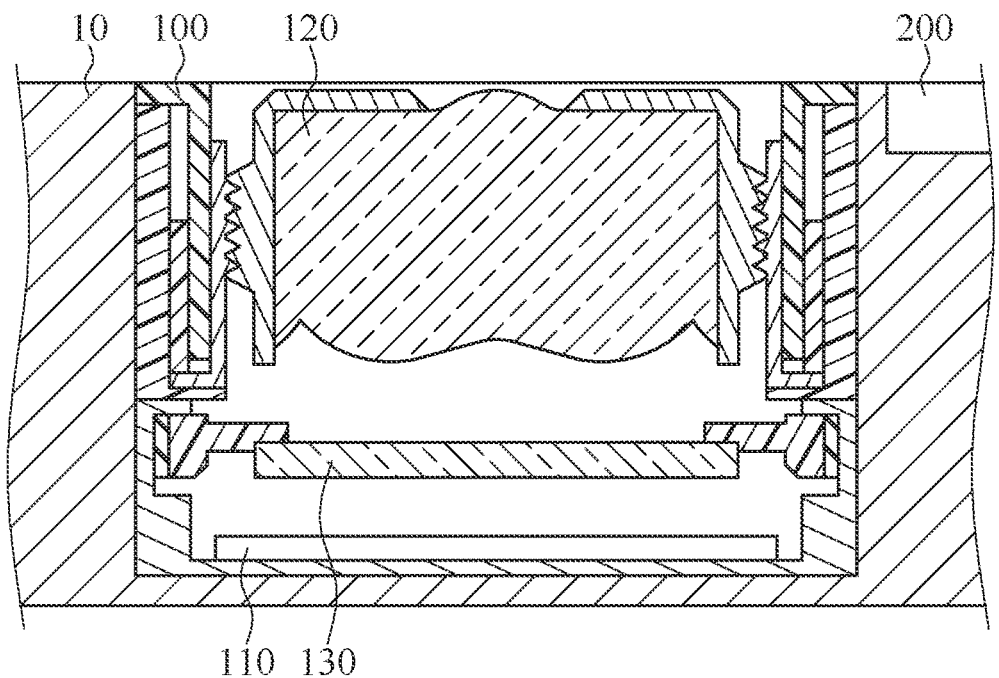
FIG. 2 is a schematic cross-sectional view of an image sensing device according to an embodiment of the present invention.

Referring to FIG. 2, FIG. 2 is a schematic cross-sectional view of an image sensing device 11 according to an embodiment of the present invention. FIG. 2 is a schematic partial cross-sectional view of the photographing assembly 100 and the invisible light transmitter 200 of the image sensing device 11 in FIG. 1. The photographing assembly 100 of the image sensing device 11 includes a sensing module 110, a lens assembly 120, and a first filter 130. The sensing module 110 and the first filter 130 are aligned with the lens assembly 120 in an axial direction of the lens assembly 120. The first filter 130 is between the lens assembly 120 and the sensing module 110. The first filter 130 allows visible light and infrared light to pass through and filters out light of other wavelengths.

Figure 3:
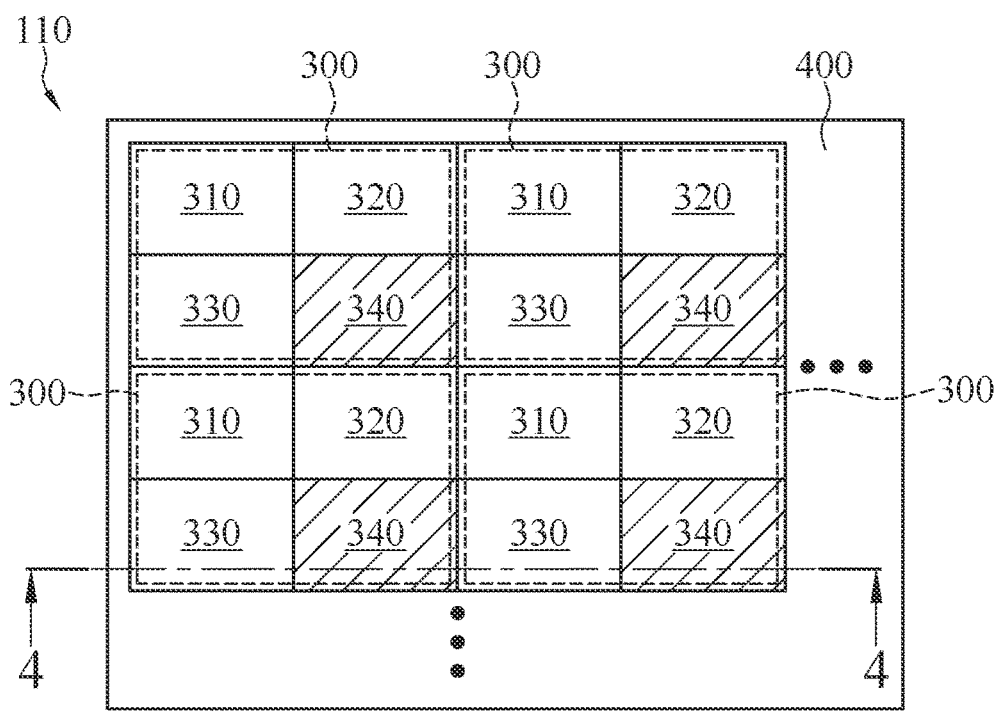
FIG. 3 is a schematic partial top view of a sensing module according to a first embodiment of the present invention.

Referring to FIG. 3, FIG. 3 is a schematic partial top view of a sensing module 110 according to a first embodiment of the present invention. The sensing module 110 includes a plurality of pixel sets 300 and a substrate 400. The plurality of pixel sets 300 are arranged in an array on the sensing module 110. The pixel sets 300 are arranged on the substrate 400. It should be understood that FIG. 3 only schematically shows a part of the sensing module 110 and four pixel sets 300 of the plurality of pixel sets 300. Each pixel set 300 includes a plurality of sub pixels and at least one invisible light sensor 340. The plurality of sub pixels and the invisible light sensor 340 in each pixel set 300 are also arranged in an array. In this embodiment, each pixel set 300 includes three sub pixels and at least one invisible light sensor 340. Three sub pixels of each of the pixel sets 300 are a first color sub pixel 310, a second color sub pixel 320, and a third color sub pixel 330, respectively. In each of the pixel sets 300, the first color sub pixel 310, the second color sub pixel 320, the third color sub pixel 330, and the invisible light sensor 340 are arranged in a 2×2 array of two columns and two rows.

As shown in FIG. 1 to FIG. 3, the invisible light transmitter 200 is disposed corresponding to the sensing module 110. The invisible light transmitter 200 can transmit invisible light. The invisible light sensor 340 may be configured to sense invisible light reflected through transmission by the invisible light transmitter 200. In this embodiment, the invisible light transmitter 200 is configured to transmit infrared light. The invisible light sensor 340 is configured to sense infrared light. The first color sub pixel 310 is a green sub pixel and is configured to sense green light in the visible light. The second color sub pixel 320 is a blue sub pixel and is configured to sense blue light in the visible light. The third color sub pixel 330 is a red sub pixel and is configured to sense red light in the visible light. In other words, data sensed by the first color sub pixel 310, the second color sub pixel 320, and the third color sub pixel 330 of each pixel set 300 may constitute pixel data (or RGB data). Pixel data of all of the pixel sets 300 of the sensing module 110 may constitute a two-dimensional color image. In addition, the image sensing device 11 may calculate depth data corresponding to each pixel set 300 by using a time difference between the infrared light transmitted by the invisible light transmitter 200 and the infrared light sensed by the invisible light sensor 340 of each of the pixel sets 300. For example, the invisible light transmitter 200 transmits specific infrared light at a time point t0. The invisible light sensors 340 of the plurality of pixel sets 300 sense reflected light of the specific infrared light at time points such as t1, t2, t3 . . . . The image sensing device 11 can calculate depth data of each of the pixel sets 300 according to differences between t1, t2, t3 . . . and t0. Finally, the image sensing device 11 may combine the pixel data with depth data of all of the pixel sets 300 of the sensing module 110 to generate a three-dimensional color image.

Figure 4:
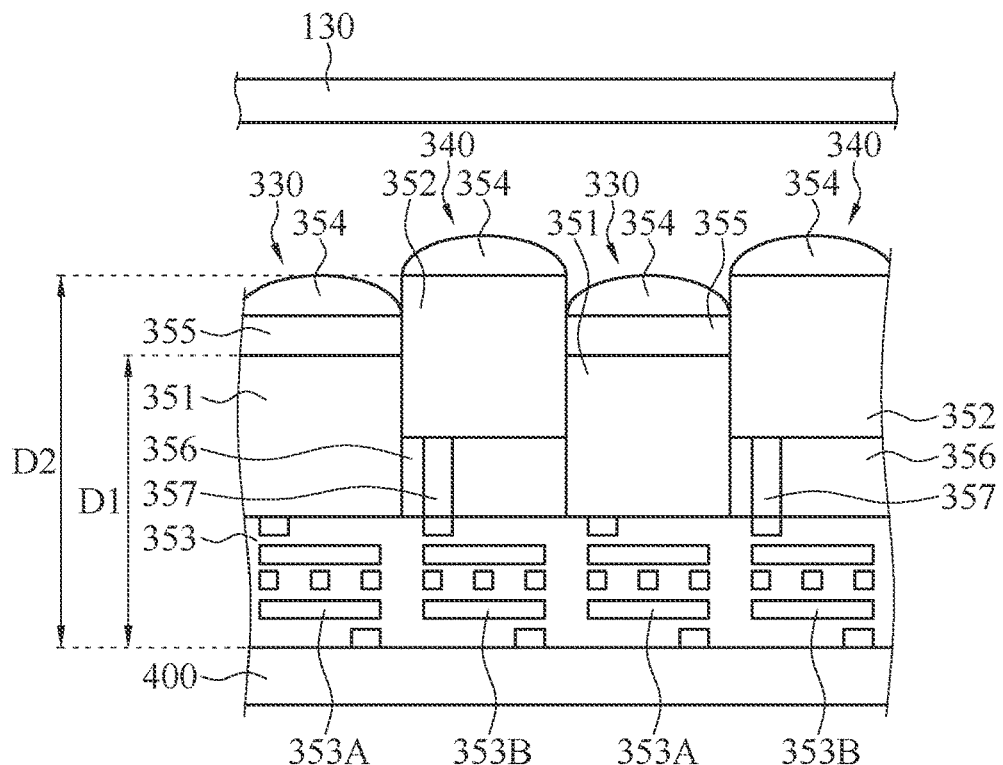
FIG. 4 is a schematic partial cross-sectional view at a line segment 4-4 of FIG. 3.

Referring to FIG. 4, FIG. 4 is a schematic partial cross-sectional view at a line segment 4-4 of FIG. 3. It should be understood that FIG. 4 only schematically shows a main structure of the pixel set 300. As shown in FIG. 4, in this embodiment, each sub pixel of each pixel set 300 includes a visible light photo diode 351. The invisible light transmitter 200 includes an invisible light photo diode 352. Each pixel set 300 further includes a circuit layer 353. The circuit layer 353 includes a plurality of first circuits 353A and at least one second circuit 353B. Each of first circuits 353A is connected to a visible light photo diode 351 of a corresponding sub pixel through a signal. The second circuit 353B is connected to the invisible light photo diode 352 of the invisible light sensor 340 through a signal. In this embodiment, the first circuit 353A and the second circuit 353B are patterned metal circuits formed on the circuit layer 353. The first circuit 353A may be configured to convey power to the visible light photo diode 351 and receive a signal generated by the visible light photo diode 351. The second circuit 353B may be configured to convey power to the invisible light photo diode 352 and receive a signal generated by the invisible light photo diode 352, but is not limited thereto.

In some embodiments, the sensing module 110 is classified into a front side illuminated (FSI) type and a back side illuminated (BSI) type according to a relative position of the circuit layer 353. If the sensing module 110 is the FSI type, it means that on an optical path of light entering the photographing assembly 100, the circuit layer 353 is in front of the visible light photo diode 351 and the invisible light photo diode 352. Light passes through the circuit layer 353 first, and then enters the visible light photo diode 351 and the invisible light photo diode 352. If the sensing module 110 is the BSI type, it means that on the optical path of the light entering the photographing assembly 100, the circuit layer 353 is behind the visible light photo diode 351 and the invisible light photo diode 352. Light does not pass through the circuit layer 353 first and then enter the visible light photo diode 351 and the invisible light photo diode 352, but directly enters the visible light photo diode 351 and the invisible light photo diode 352.

As shown in FIG. 4, in this embodiment, the sensing module 110 is the BSI type. The circuit layer 353 is between the substrate 400 and the visible light photo diode 351, and between the substrate 400 and the invisible light photo diode 352. When the light passes through the first filter 130 and enters the visible light photo diode 351 and the invisible light photo diode 352, the light does not pass through the circuit layer 353 first. For example, the circuit layer 353 is formed on the substrate 400. The plurality of visible light photo diodes 351 and the plurality of invisible light photo diodes 352 of all of the pixel sets 300 are arranged on the circuit layer 353. Each of the visible light photo diodes 351 is respectively aligned with each other and electrically connected to each of the corresponding first circuits 353A. Each of the invisible light photo diodes 352 is respectively aligned with each other and electrically connected to each of the corresponding second circuits 353B.

As shown in FIG. 4, in this embodiment, each pixel set 300 further includes a plurality of microlenses 354 and a plurality of second filters 355. Each of the second filters 355 is respectively aligned with a corresponding visible light photo diode 351. Each of the visible light photo diodes 351 is between a corresponding second filter 355 and the circuit layer 353 respectively. The plurality of microlenses 354 are respectively aligned with a corresponding visible light photo diode 351 and a corresponding invisible light photo diode 352. The plurality of microlenses 354 are between the first filter 130 and the corresponding second filter 355. The other plurality of microlenses 354 are between the first filter 130 and a corresponding invisible light photo diode 352 respectively. The microlenses 354 can increase an amount of light received by the visible light photo diode 351 and the invisible light photo diode 352.

In this embodiment, each pixel set 300 further includes at least one focus adjustment member 356. The focus adjustment member 356 is configured to change a distance between the visible light photo diode 351 or the invisible light photo diode 352 and the substrate 400. In other words, the focus adjustment member 356 can make a distance between each visible light photo diode 351 and the substrate 400 smaller or greater than a distance between the invisible light photo diode 352 and the substrate 400, so as to make visible light and invisible light passing through the lens assembly 120 and the first filter 130 be separately and accurately focused on the visible light photo diode 351 and the invisible light photo diode 352 at different intervals on the optical path. In some embodiments, the focus adjustment member 356 may be between the invisible light photo diode 352 and the substrate 400, but is not limited thereto. In some embodiments, the focus adjustment member 356 may be between the invisible light photo diode 351 and the substrate 400, which is described in detail later.

In this embodiment, the second filter 355, the visible light photo diode 351, and the first circuit 353A of the circuit layer 353 constitutes a sub pixel. The microlenses 354 are aligned with a second filter 355 of a corresponding sub pixel. In view that a second filter 355 of a sub pixel allows red right, green light, or blue light of the visible light to pass through, the sub pixel may be defined as a first color sub pixel 310, a second color sub pixel 320, or a third color sub pixel 330. Taking the third color sub pixel 330 as an example, a second filter 355 of the third color sub pixel only allows the red light of visible light to pass through. The third color sub pixel 330 is a red sub pixel. When the visible light and the infrared light that pass through the first filter 130 further pass through the microlenses 354 and the second filter 355 of the third color sub pixel 330, only the red light of the visible light enters the visible light photo diode 351. Therefore, the third color sub pixel 330 generates data corresponding to the red light.

In this embodiment, the invisible light photo diode 352 and the second circuit 353B of the circuit layer 353 constitute one invisible light sensor 340. The microlenses 354 are aligned with an invisible light photo diode 352 of a corresponding invisible light sensor 340. In this embodiment, the invisible light photo diode 352 can only sense infrared light. Therefore, there is no need to provide the second filter 355 above the invisible light photo diode 352. When the visible light and the infrared light that pass through the first filter 130 further pass through the microlenses 354 to enter the invisible light photo diode 352, the invisible light sensor 340 generates data corresponding to the infrared light.

In the image sensing device 11, external light passes through the lens assembly 120, passes through the first filter 130, and is projected onto the sensing module 110. On the sensing module 110, the sub pixel that is configured to sense the visible light and the invisible light sensor 340 that is configured to sense infrared light may sense the projected light and generate corresponding data. However, based on a difference between wavelengths of the visible light and the invisible light, or based on a structure or optical character difference between the microlenses 354 corresponding to the sub pixel and the microlenses 354 corresponding to the invisible light sensor 340, or based on the structure or optical character difference of other optical elements not shown in figures, a certain degree of influence is produced in optical imaging, making imaging positions or focuses of the visible light and the invisible light different. In different embodiments, in order to make definition and depth data of a three-dimensional image more accurate, the focus adjustment member 356 is configured to change a distance between the visible light photo diode 351 or the invisible light photo diode 352 and the substrate 400. Accordingly, a distance between the visible light photo diode 351 or the invisible light photo diode 352 and the first filter 130 or the lens assembly 120 is changed. Therefore, the imaging positions or focuses of the visible light and the invisible light may just fall on the visible light photo diode 351 and invisible light photo diode 352.

As shown in FIG. 4, in this embodiment, the focus adjustment member 356 is between the invisible light photo diode 352 and the second circuit 353B. Compared to the visible light photo diode 351, the focus adjustment member 356 makes the invisible light photo diode 352 away from the substrate 400 relatively. A top of the visible light photo diode 351 is separated from the substrate 400 by a first distance D1. A top of the invisible light photo diode 352 is separated from the substrate 400 by a second distance D2. The first distance D1 is less than the second distance D2.

In this embodiment, the focus adjustment member 356 is made of an insulating material, but is not limited thereto. In a manufacturing process of the sensing module 110, the circuit layer 353 is first formed on the substrate 400. The focus adjustment member 356 is then formed on the circuit layer 353. Next, the visible light photo diode 351 and the invisible light photo diode 352 are formed on the circuit layer 353 and the focus adjustment member 356. In this embodiment, an extension circuit 357 may further be formed in the focus adjustment member 356. The extension circuit 357 may be electrically connected to the invisible light photo diode 352 and a corresponding second circuit 353B.

For example, when the image sensing device 11 is to generate a three-dimensional image, the visible light is focused on a visible light photo diode 351 at a first distance D1 from the substrate 400, and the sub pixels senses the visible light to generate pixel data. At this time, the image sensing device 11 may generate a clear two-dimensional color image, and the infrared light is focused on an invisible light photo diode 352 at a second distance D2 from the substrate 400, and the invisible light sensor 340 senses the infrared light to generate depth data. At this time, the image sensing device 11 may generate a clear two-dimensional infrared light image. Each pixel of the two-dimensional infrared light image has corresponding depth data. Pixel data generated by the plurality of sub pixels of each pixel set 300 corresponds to the depth data generated by the invisible light sensor 340. Because the pixel data and the depth data are respectively generated in a case that focuses are correct, each pixel of the two-dimensional color image may correctly correspond to the corresponding pixel and depth data of the two-dimensional infrared image. Therefore, the image sensing device 11 may superimpose the two-dimensional color image and the two-dimensional infrared light image to correspondingly generate a clear three-dimensional color image having correct depth data.

Figure 5:
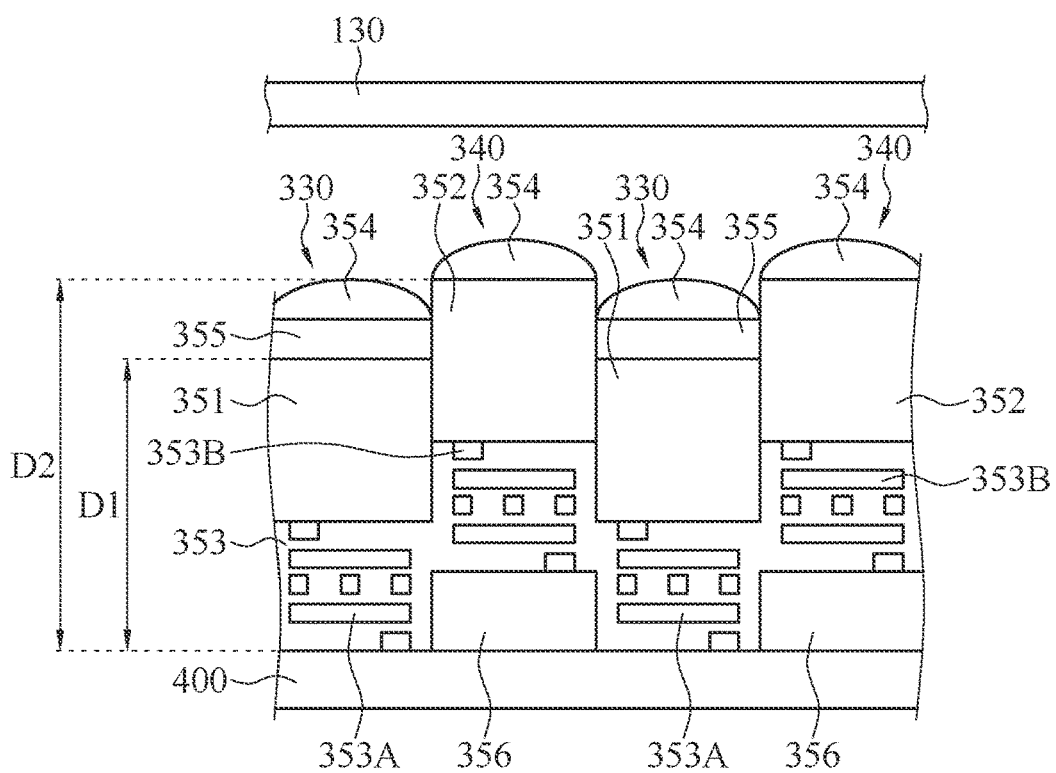
FIG. 5 is a schematic partial cross-sectional view of a sensing module according to a second embodiment of the present invention.
Figure 6:
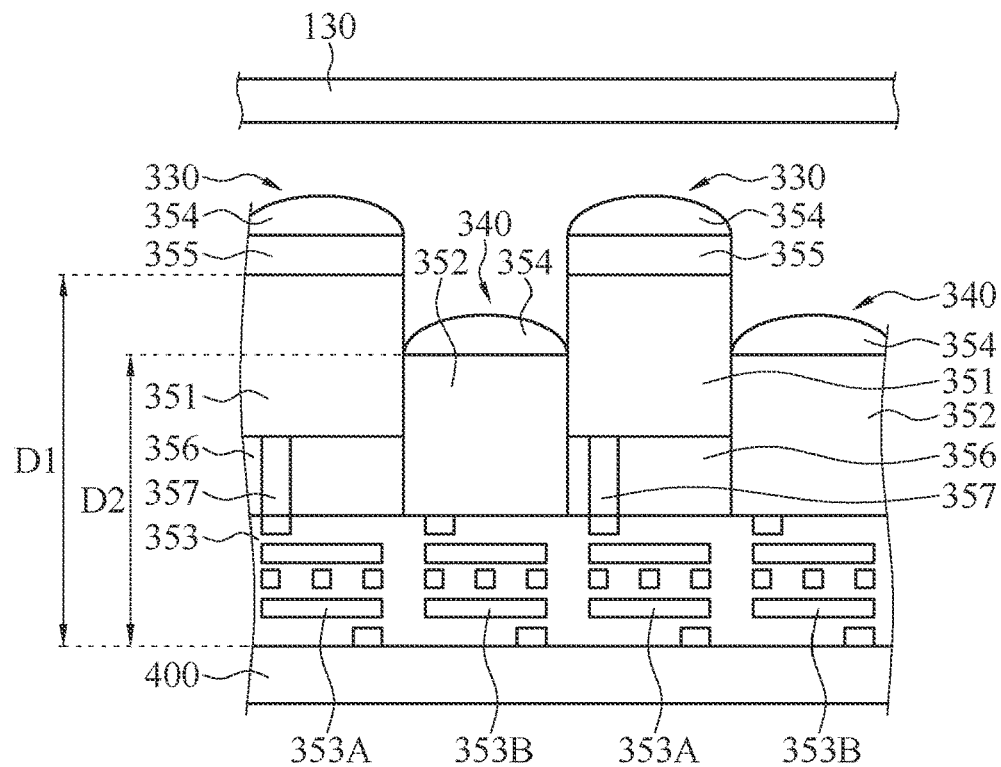
FIG. 6 is a schematic partial cross-sectional view of a sensing module according to a third embodiment of the present invention.
Figure 7:
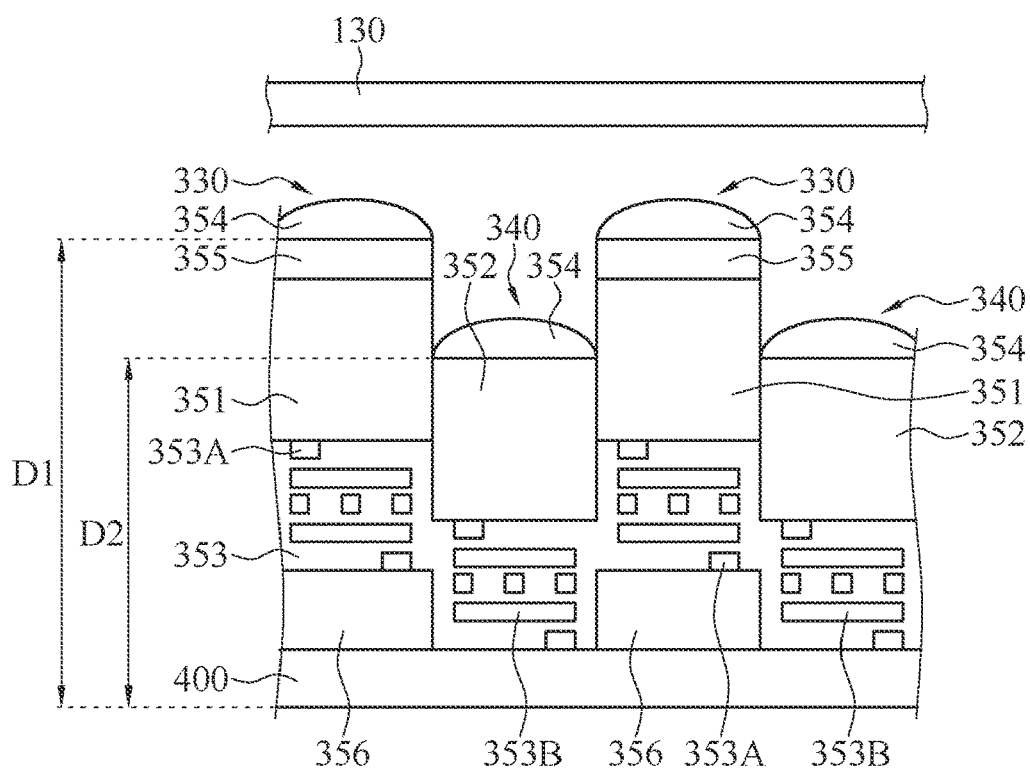
FIG. 7 is a schematic partial cross-sectional view of a sensing module according to a fourth embodiment of the present invention.

Referring to FIG. 5 to FIG. 7, FIGS. 5 to 7 are schematic partial cross-sectional views of a sensing module 110 according to a second embodiment, a third embodiment, and a fourth embodiment of the present invention, respectively. A main difference between sensing modules 110 in FIGS. 5 to 7 and FIG. 4 is a relative position of a focus adjustment member 356. As shown in FIG. 5 to FIG. 7, in the second embodiment, the third embodiment, and the fourth embodiment, the sensing modules 110 are all BSI type. As shown in FIG. 5, in the second embodiment, the focus adjustment member 356 is between a substrate 400 and a second circuit 353B. In a manufacturing process of the sensing module 110, the focus adjustment member 356 is first formed on the substrate 400. The circuit layer 353 is then formed on the substrate 400 and the focus adjustment member 356. Next, a visible light photo diode 351 and an invisible light photo diode 352 are formed on a circuit layer 353. Similarly, the focus adjustment member 356 makes the invisible light photo diode 352 far away from the substrate 400 relatively. A top of the visible light photo diode 351 is separated from the substrate 400 by a first distance D1. A top of the invisible light photo diode 352 is separated from the substrate 400 by a second distance D2. The first distance D1 is less than the second distance D2. In some embodiments, the focus adjustment member 356 may be a protruding structure protruding from a specific position on the substrate 400. In some embodiments, the focus adjustment member 356 may be integrated with the substrate 400.

As shown in FIG. 6 and FIG. 7, in the third embodiment and the fourth embodiment, based on differences between the microlenses 354 or other optical elements in optics and structure, after the light passes through the lens assembly 120, a focal length of the visible light may be smaller than a focal length of the invisible light. In this case, the focus adjustment member 356 may be disposed corresponding to the visible light photo diode 351 of the sub pixel to change a relative position of the visible light photo diode 351. As shown in FIG. 6, in the third embodiment, the focus adjustment member 356 is between the visible light photo diode 351 and the first circuit 353A. As shown in FIG. 7, in the fourth embodiment, the focus adjustment member 356 is between the substrate 400 and the first circuit 353A. In either of the third embodiment or the fourth embodiment, the focus adjustment member 356 makes the visible light photo diode 351 far away from the substrate 400 relatively. A top of the visible light photo diode 351 is separated from the substrate 400 by a first distance D1. A top of the invisible light photo diode 352 is separated from the substrate 400 by a second distance D2. The first distance D1 is greater than the second distance D2.

Figure 8:
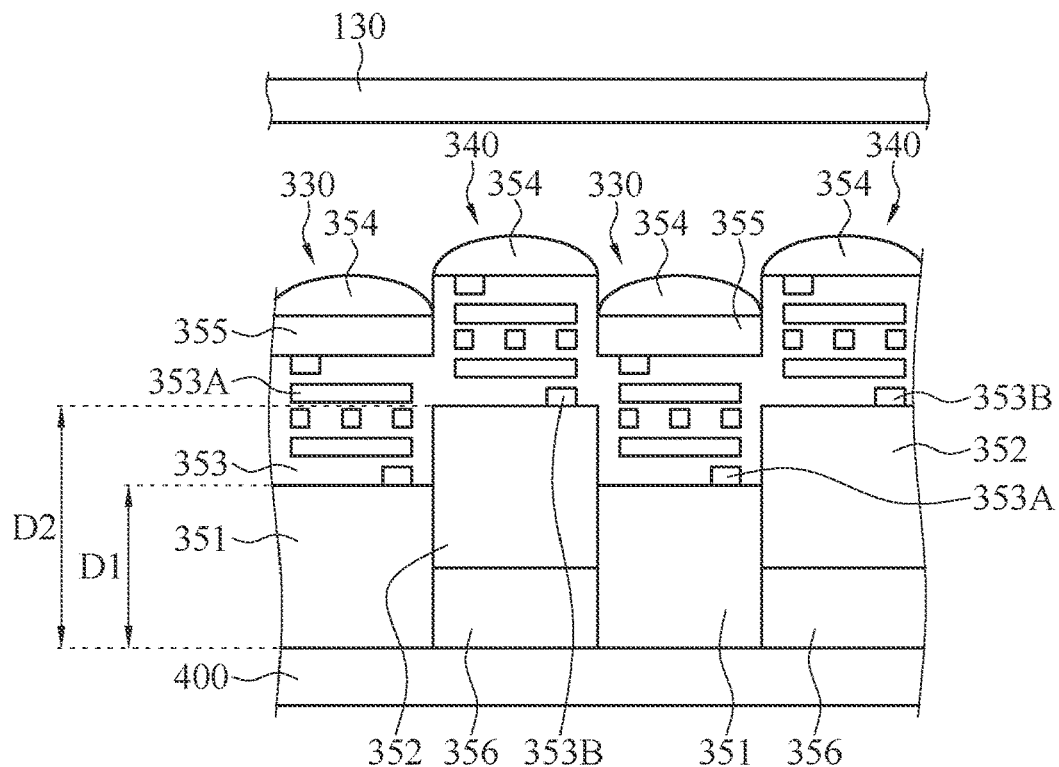
FIG. 8 is a schematic partial cross-sectional view of a sensing module according to a fifth embodiment of the present invention.
Figure 9:
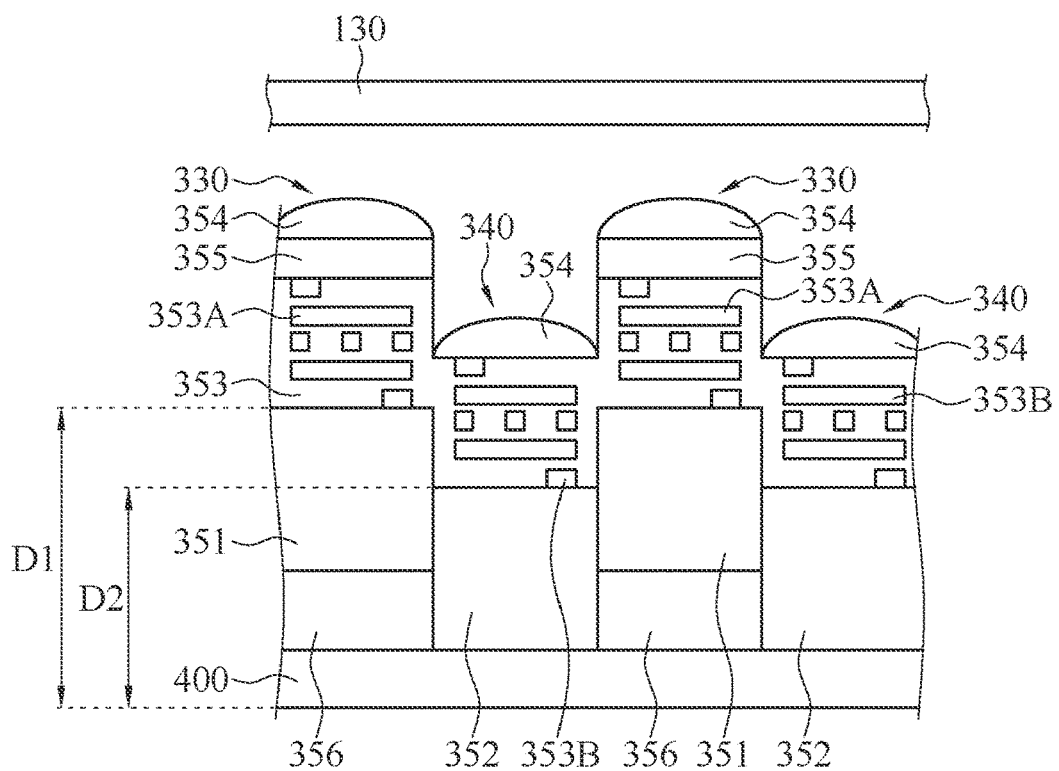
FIG. 9 is a schematic partial cross-sectional view of a sensing module according to a sixth embodiment of the present invention.

Referring to FIG. 8 and FIG. 9, FIGS. 8 and 9 are schematic partial cross-sectional views of a sensing module 110 according to a fifth embodiment and a sixth embodiment of the present invention, respectively. A main difference between the sensing modules 110 of FIG. 8 and FIG. 9 and FIG. 4 is that the sensing modules 110 of FIG. 8 and FIG. 9 are FSI type. As shown in FIG. 8 and FIG. 9, in the fifth embodiment and the sixth embodiment, the visible light photo diode 351 and the invisible light photo diode 352 are between the circuit layer 353 and the substrate 400. After light passes through the first filter 130, the light first passes through the circuit layer 353 and then enters the visible light photo diode 351 and the invisible light photo diode 352. A plurality of visible light photo diodes 351 and a plurality of invisible light photo diodes 352 of all of the pixel sets 300 are arranged on the substrate 400. The circuit layer 353 is formed on the visible light photo diodes 351 and the invisible light photo diodes 352. Each of the visible light photo diodes 351 is respectively aligned with and electrically connected to each of the corresponding first circuits 353A. Each of the invisible light photo diodes 352 is respectively aligned with each other and electrically connected to each of the corresponding second circuits 353B.

As shown in FIG. 8, in the fifth embodiment, the focus adjustment member 356 is between the invisible light photo diode 352 and the substrate 400. In a manufacturing process of the sensing module 110, the focus adjustment member 356 is first formed on the substrate 400. The visible light photo diode 351 and the invisible light photo diode 352 are then formed on the substrate 400 and the focus adjustment member 356. Next, the circuit layer 353 is formed on the visible light photo diode 351 and the invisible light photo diode 352. The focus adjustment member 356 makes the invisible light photo diode 352 far away from the substrate 400 relatively. A top of the visible light photo diode 351 is separated from the substrate 400 by a first distance D1. A top of the invisible light photo diode 352 is separated from the substrate 400 by a second distance D2. The first distance D1 is less than the second distance D2. As shown in FIG. 9, in the sixth embodiment, the focus adjustment member 356 is between the visible light photo diode 351 and the substrate 400. The focus adjustment member 356 makes the visible light photo diode 351 far away from the substrate 400 relatively. A top of the visible light photo diode 351 is separated from the substrate 400 by a first distance Dl. A top of the invisible light photo diode 352 is separated from the substrate 400 by a second distance D2. The first distance D1 is greater than the second distance D2.

Figure 10:
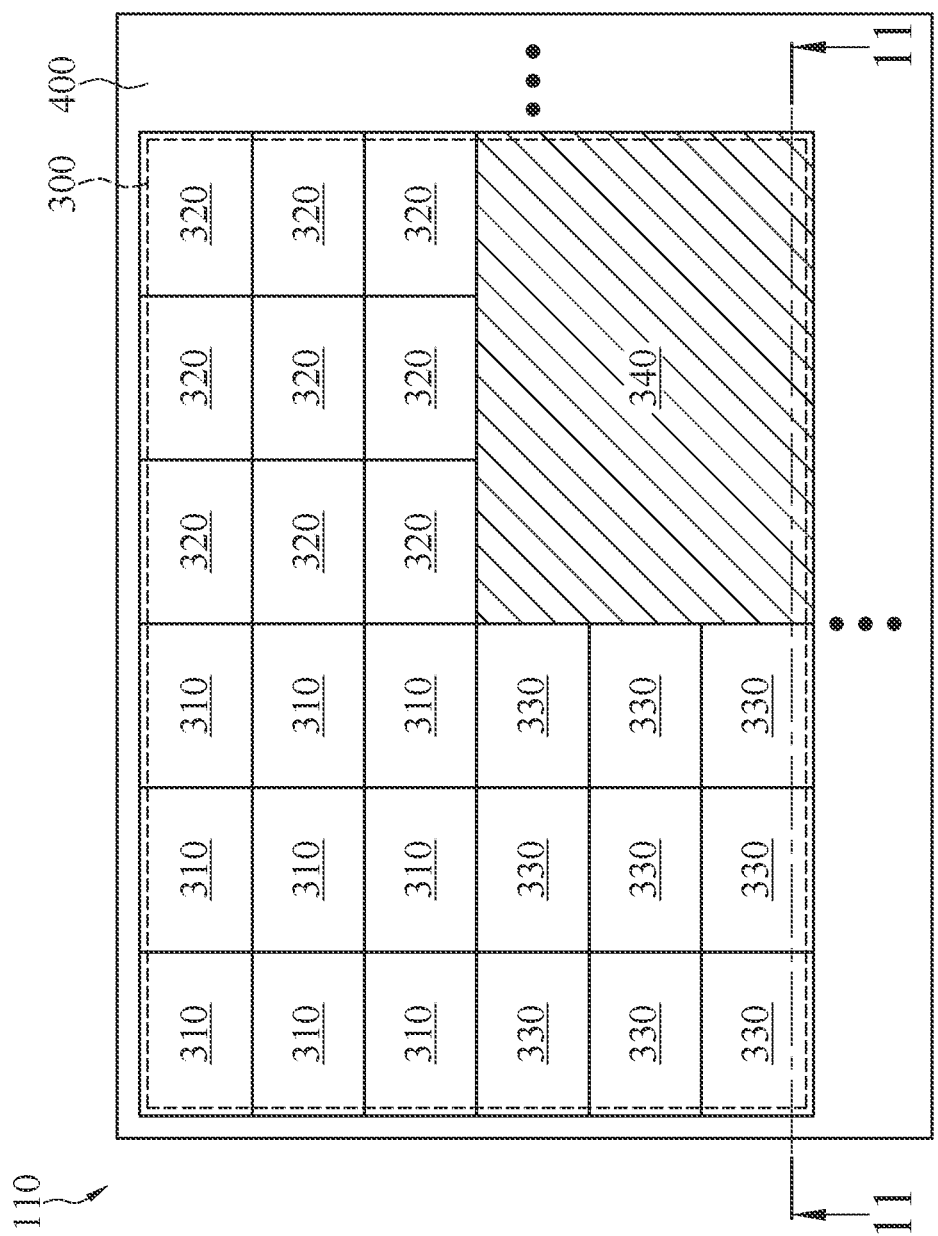
FIG. 10 is a schematic partial top view of a sensing module according to a seventh embodiment of the present invention.

Referring to FIG. 10, FIG. 10 is a schematic partial top view of a sensing module 110 according to a seventh embodiment of the present invention. As shown in FIG. 10, in each pixel set 300, there are nine first color sub pixels 310 arranged in a first array of three columns and three rows, and there are nine second color sub pixels 320 arranged in a second array of three columns and three rows, and there are nine third color sub pixels 330 arranged in a third array of three columns and three rows. There is a single invisible light sensor 340. The first array, the second array, the third array, and the single invisible light sensor 340 are arranged in an array of two columns and two rows. In this embodiment, a width of a sub pixel is about 1 to 2 microns. A width of a 3×3 array constituted by the nine sub pixels is about 3 to 6 microns. A width of the single invisible light sensor 340 is about 4 to 7 microns. Therefore, the three 3×3 sub pixel arrays and the single invisible light sensor 340 may be arranged in a pixel set 300 of a 2×2 array.

Figure 11:
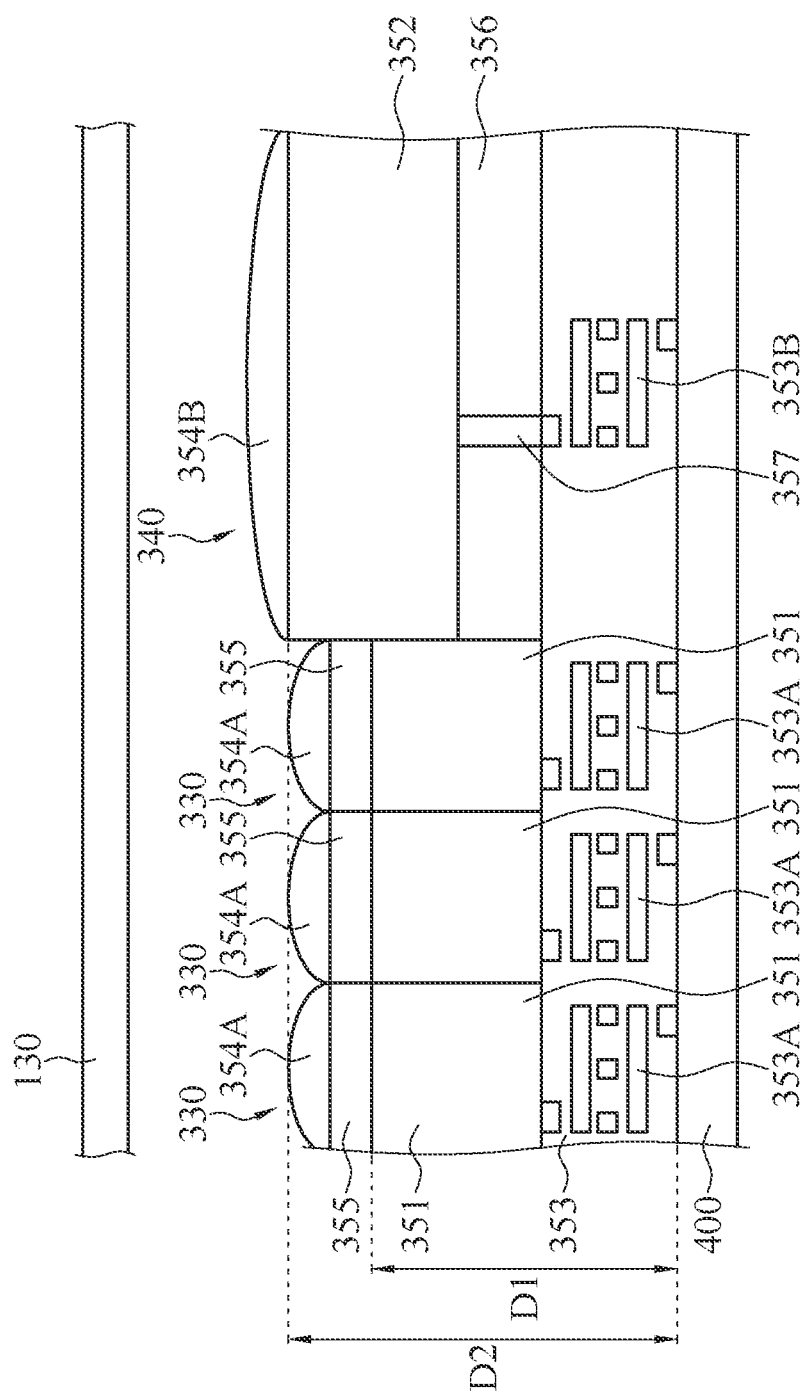
FIG. 11 is a schematic partial cross-sectional view at a line segment 11-11 of FIG. 10.

Referring to FIG. 11, FIG. 11 is a schematic partial cross-sectional view at a line segment 11-11 of FIG. 10. A main difference between sensing modules 110 of FIG. 11 and FIG. 4 is that a width of a single invisible light sensor 340 of a sensing module 110 of FIG. 11 is greater than a width of a single sub pixel. Correspondingly, microlenses 354 include a first microlens 354A having a narrow width and a second microlens 354B having a wider width. The first microlens 354A is disposed corresponding to a sub pixel. The second microlens 354B corresponds to an invisible light sensor 340. In this embodiment, the first microlens 354A is located on a second filter 355. The second microlens 354B is located on an invisible light photo diode 352. A focus adjustment member 356 is between the invisible light photo diode 352 and a second circuit 353B. An extension line 357 of the focus adjustment member 356 is electrically connected to the invisible light photo diode 352 and the second circuit 353B. A top of the visible light photo diode 351 is separated from the substrate 400 by a first distance D1. A top of the invisible light photo diode 352 is separated from the substrate 400 by a second distance D2. The first distance D1 is less than the second distance D2.

Based on the foregoing descriptions, according to the image sensing device proposed in the embodiments of the present invention, the distance between the pixel set arranged on the substrate and the lens assembly is fixed, and the focal lengths of the sub pixels and the invisible light sensor are different. In this case, because the focus adjustment member may change the distance between each visible light photo diode and the lens assembly or the distance between the invisible light photo diode and the lens assembly, the visible light and the invisible light may respectively be focused on the sub pixels and the invisible light sensor correctly, to generate a clear two-dimensional image and accurate depth data simultaneously. Through combination of the depth data with the two-dimensional image, the image sensing device can generate a three-dimensional image quickly and accurately.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An image sensing device, comprising:
a sensing module comprising a plurality of pixel sets and a substrate, wherein the pixel sets are arranged on the substrate, and each of the pixel sets comprises a plurality of sub pixels, at least one invisible light sensor, and at least one focus adjustment member, wherein the plurality of sub pixels and the invisible light sensor are arranged in an array, each of the sub pixel comprises a visible light photo diode, the invisible light sensor comprises an invisible light photo diode, and the focus adjustment member is between each visible light photo diode and the substrate or between the invisible light photo diode and the substrate, and the focus adjustment member makes a distance between the visible light photo diode and the substrate less than or greater than a distance between the invisible light photo diode and the substrate; and
an invisible light transmitter disposed corresponding to the sensing module, wherein the invisible light sensor is configured to sense invisible light transmitted by the invisible light transmitter.

2. The image sensing device according to claim 1, wherein each of the pixel sets comprises a circuit layer, the circuit layer comprises a plurality of first circuits and a second circuit, a signal of each of the first circuits is connected to the corresponding sub pixel, and a signal of the second circuit is connected to the invisible light sensor.

3. The image sensing device according to claim 2, wherein the circuit layer is between the substrate and the visible light photo diode and between the substrate and the invisible light photo diode.

4. The image sensing device according to claim 3, wherein the focus adjustment member is between the invisible light photo diode and the second circuit; or the focus adjustment member is between the substrate and the second circuit.

5. The image sensing device according to claim 3, wherein the focus adjustment member is between the visible light photo diode and the first circuit; or the focus adjustment member is between the substrate and the first circuit.

6. The image sensing device according to claim 2, wherein the visible light photo diode and the invisible light photo diode are between the circuit layer and the substrate.

7. The image sensing device according to claim 6, wherein the focus adjustment member is between the invisible light photo diode and the substrate.

8. The image sensing device according to claim 6, wherein the focus adjustment member is between the visible light photo diode and the substrate.

9. The image sensing device according to claim 1, wherein the plurality of sub pixels of each of the pixel sets comprise a first color sub pixel, a second color sub pixel, and a third color sub pixel.

10. The image sensing device according to claim 9, wherein in each of the pixel sets, there are nine first color sub pixels arranged in a first array of three columns and three rows, there are nine second color sub pixels arranged in a second array of three columns and three rows, there are nine third color sub pixels arranged in a third array of three columns and three rows, and there is a single invisible light sensor, wherein the first array, the second array, the third array, and the single invisible light sensor are arranged in an array of two columns and two rows.

* * * * *